(12) United States Patent
Hiner et al.

(10) Patent No.: US 6,707,083 B1
(45) Date of Patent: Mar. 16, 2004

(54) MAGNETIC TUNNELING JUNCTION WITH IMPROVED POWER CONSUMPTION

(75) Inventors: Hugh C. Hiner, Fremont, CA (US); Kyusik Sin, Pleasanton, CA (US); Matthew Gibbons, Livermore, CA (US); Xizeng Shi, Fremont, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 10/192,458

(22) Filed: Jul. 9, 2002

(51) Int. Cl.[7] .......................................... H01L 31/119
(52) U.S. Cl. ........................................ 257/295; 257/294
(58) Field of Search .............................. 257/295, 296, 257/421, 422; 600/412; 438/3; 365/158, 173; 301/171

(56) References Cited

U.S. PATENT DOCUMENTS

| | | | |
|---|---|---|---|
| 4,240,439 A | * 12/1980 | Abe et al. ................. | 600/412 |
| 6,174,737 B1 | * 1/2001 | Durlam et al. ............. | 438/3 |
| 6,322,640 B1 | * 11/2001 | Xiao et al. ................. | 148/308 |
| 6,548,849 B1 | * 4/2003 | Pan et al. .................. | 257/296 |
| 2001/0050859 A1 | * 12/2001 | Schwarzl ................... | 365/158 |
| 2002/0141232 A1 | * 10/2002 | Saito et al. ................ | 365/158 |

* cited by examiner

*Primary Examiner*—David Nelms
*Assistant Examiner*—Thinh T Nguyen
(74) *Attorney, Agent, or Firm*—Sawyer Law Group LLP

(57) ABSTRACT

A method and system for providing a magnetic tunneling junction is disclosed. The method and system includes providing a free layer, a pinned layer, and a barrier between the free layer and the pinned layer. The free layer and the pinned layer are ferromagnetic. The barrier layer is an insulator. The magnetic tunneling junction is coupled to a bit line. The bit line includes a ferromagnetic liner and a nonmagnetic core. The nonmagnetic core includes a top, a bottom and sides. The ferromagnetic liner includes at least one tab and is adjacent to the sides and a portion of the bottom of the nonmagnetic core. The at least one tab is adjacent to the portion of the bottom of the nonmagnetic core.

17 Claims, 9 Drawing Sheets

MAGNETIC TUNNELING JUNCTION WITH IMPROVED POWER CONSUMPTION

FIELD OF THE INVENTION

The present invention relates to magnetic system, and more particularly to a method and system for providing magnetic tunneling junctions having improved reliability.

BACKGROUND OF THE INVENTION

Because of their high magnetoresistance ratio, spin dependent tunneling sensors, otherwise known as magnetic tunneling junctions (MTJs), are currently of interest for use in a variety of devices, including magnetic memories such as magnetic random access memories (MRAM). FIG. 1 depicts a portion of a conventional magnetic memory, a conventional MRAM 1. The conventional MRAM 1 includes MTJs 10. Each MTJ 10 includes at least a conventional pinned layer 20, a conventional barrier layer 30 and a conventional free layer 40. The conventional barrier layer 30 is typically an insulator that serves as a tunneling barrier between the conventional pinned layer 20 and the conventional free layer 40. The conventional pinned layer 20 and the conventional free layer 40 are ferromagnetic. The magnetization of the conventional pinned layer 20 is pinned in a particular direction, generally by an anitiferromagnetic layer (not shown). The magnetization of the conventional free layer 40 is free to rotate in response to an external field. The conventional MRAM 1 includes a conventional bit line 60 and a conventional bottom lead 50. Current through the MTJ 10 is carried by the conventional bit line 60 and the conventional bottom lead 50. The magnetic MTJ 10 is switched using a combination of current driven through the bit line 60 and the magnetic tunneling junction 10 and the current through the corresponding digit line 70.

FIG. 2 is a diagram of a cross-sectional view of a portion of the magnetic memory 1. A magnetic tunneling junction 10 having the pinned layer 20, barrier layer 30 and free layer 40 are shown. The magnetic tunneling junction 10 is surrounded by an insulator (not explicitly shown). The magnetic tunneling junction typically includes an antiferromagnetic layer (not shown) and other layers, such as seed and/or capping layers. The bit line 60 is typically composed of a nonmagnetic conductive material, such as Cu. In order to switch the direction of magnetization of the magnetization of the free layer 40, current is driven through the bit line 60 and the digit line 70 (not shown in FIG. 2).

Although the conventional MRAM 1 functions, one of ordinary skill in the art will readily recognize that the conventional MRAM 1 consumes a great deal of power. In particular, a relatively large current is required in order to switch the magnetization of the free layer. As a result, a large amount of power is also consumed in order to switch the magnetization of the free layer 40. Consequently, the MRAM 1 utilizes a large amount of power when programming an MTJ 10.

Accordingly, what is needed is a system and method for decreasing the amount of power utilized by an MRAM. The present invention addresses such a need.

SUMMARY OF THE INVENTION

The present invention provides a method and system for providing a magnetic tunneling junction. The method and system comprise providing a free layer, a pinned layer, and a barrier between the free layer and the pinned layer. The free layer and the pinned layer are ferromagnetic. The barrier layer is an insulator. The magnetic tunneling junction is coupled to a bit line. The bit line includes a ferromagnetic liner and a nonmagnetic core. The nonmagnetic core includes a top, a bottom and sides. The ferromagnetic liner includes at least one tab and is adjacent to the sides and a portion of the bottom of the nonmagnetic core. The at least one tab is adjacent to the portion of the bottom of the nonmagnetic core.

According to the system and method disclosed herein, the present invention provides a magnetic tunneling junction that can be programmed using less power.

DETAILED DESCRIPTION OF THE INVENTION

The present invention relates to an improvement in spin dependent tunneling sensors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a magnetic tunneling junction. The method and system comprise providing a free layer, a pinned layer, and a barrier between the free layer and the pinned layer. The free layer and the pinned layer are ferromagnetic. The barrier layer is an insulator. The magnetic tunneling junction is coupled to a bit line. The bit line includes a ferromagnetic liner and a nonmagnetic core. The nonmagnetic core includes a top, a bottom and sides. The ferromagnetic liner includes at least one tab and is adjacent to the sides and a portion of the bottom of the nonmagnetic core. The at least one tab is adjacent to the portion of the bottom of the nonmagnetic core.

The present invention will be described in terms of a particular spin-dependent tunneling sensor using particular materials and having particular components. However, one of ordinary skill in the art will readily recognize that this method and system will operate effectively for other spin-dependent tunneling sensors using other materials and having other and/or different components that are consistent with the present invention. The present invention is also described in the context of a particular magnetic memory. However, one of ordinary skill in the art will readily realize that the present invention is consistent with other memories utilizing spin-dependent tunneling sensors for storing data.

Figure 1:
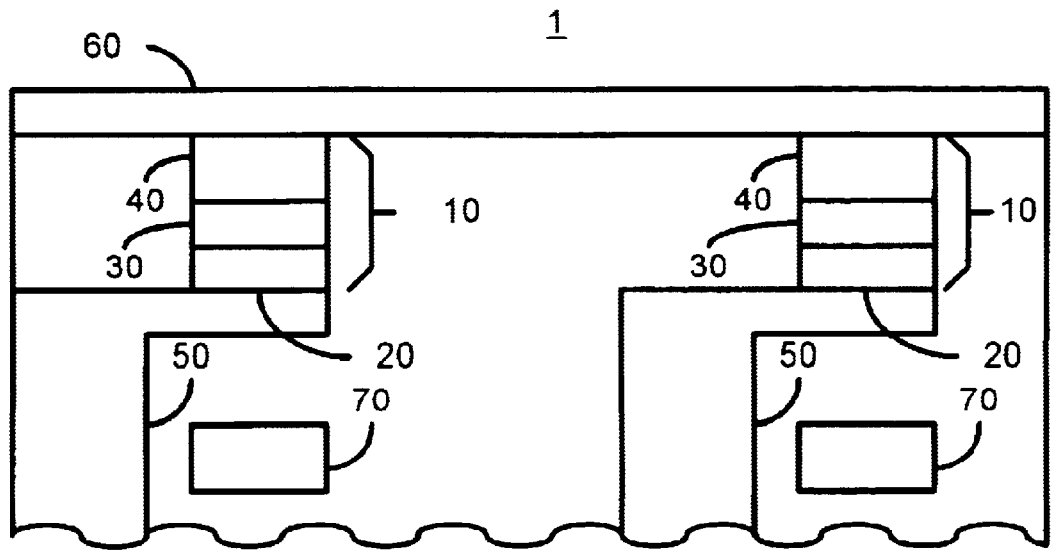
FIG. 1 is a diagram of a conventional memory array using conventional magnetic tunneling junctions.
Figure 2:
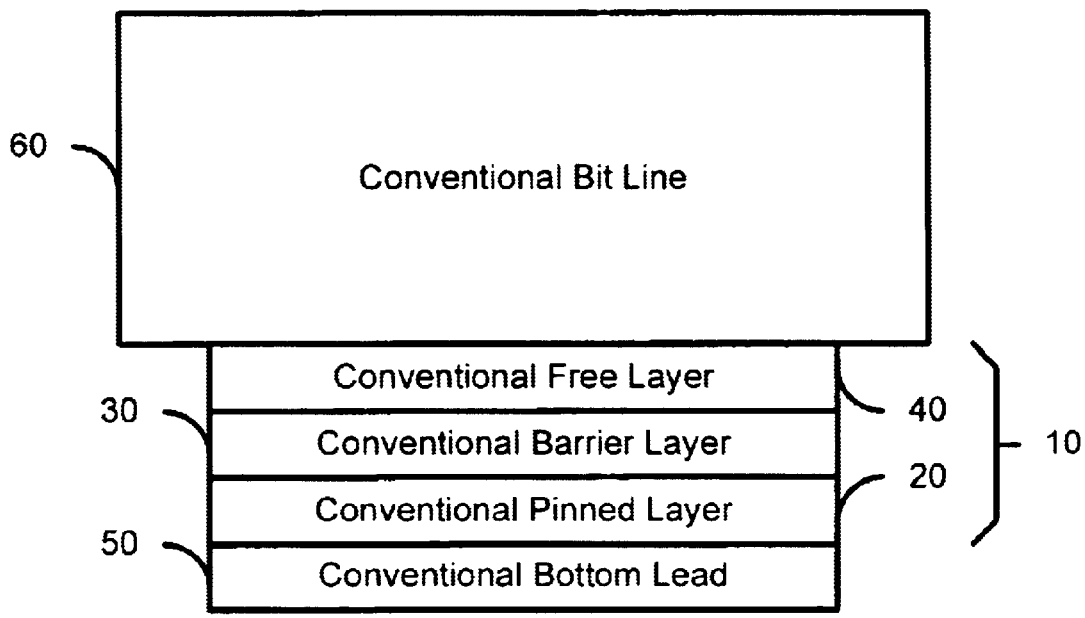
FIG. 2 is a diagram of a cross section of a portion of the conventional magnetic memory including the digit lines and FIG. 3 is a diagram of one embodiment of a magnetic tunneling junction using a first embodiment of a bit line in accordance with the present invention.
Figure 3:
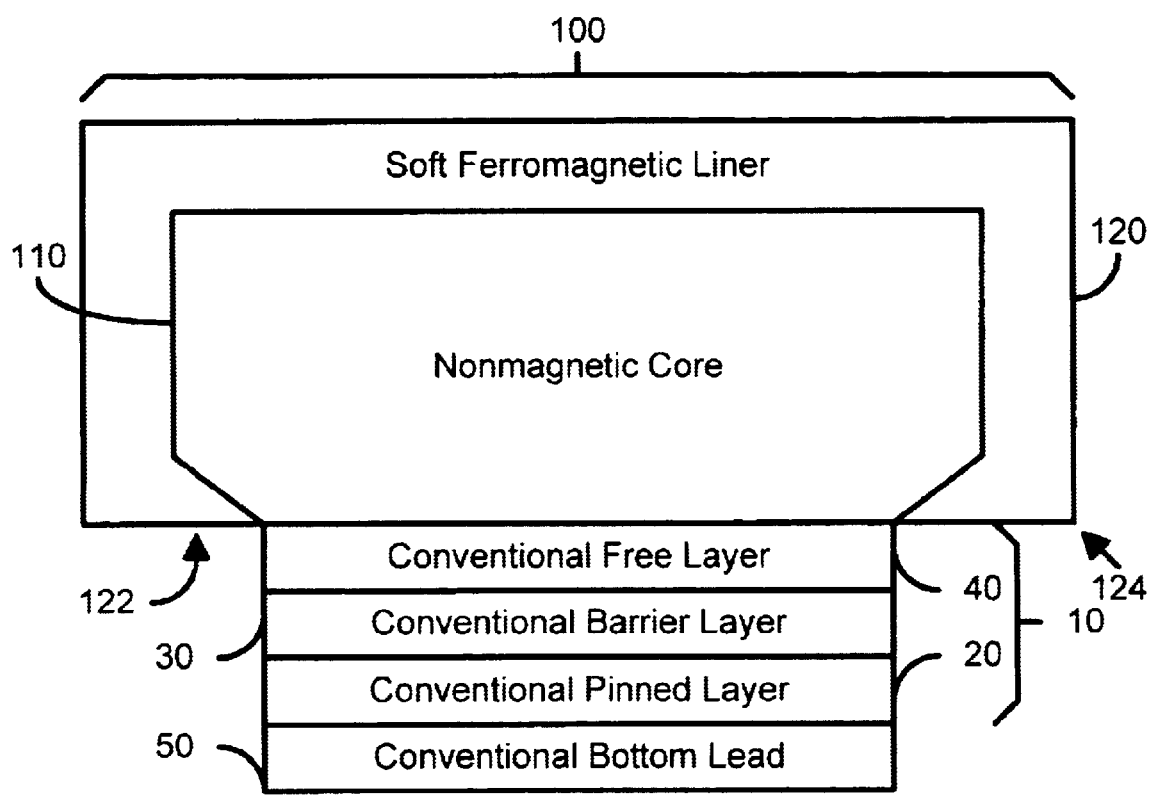

To more particularly illustrate the method and system in accordance with the present invention refer now to FIG. 3, depicting one embodiment of a magnetic tunneling junction 10 utilizing a first embodiment of a bit line 100 in accordance with the present invention. The magnetic tunneling junction 10 includes a pinned layer 20, a barrier layer 30 and a free layer 40. The pinned layer 20 and the free layer 40 are ferromagnetic. The pinned layer 20 and/or the free layer 40 may be synthetic. Other layers may also be synthetic, multilayers, alloys or other materials. The pinned layer 20 has its magnetization substantially fixed, while the magnetization of the free layer 40 can respond to an applied magnetic field. Generally, the magnetization of the pinned layer 20 is fixed using an antiferromagnetic layer (not shown) grown on an appropriate seed layer (not shown). The barrier layer 30 is an insulating layer sufficiently thin to allow the tunneling of current carriers between the pinned layer 20 and the free layer 40. The magnetic tunneling junction 10 is preferably grown on a bottom lead 50.

The bit line 100 preferably resides on the magnetic tunneling junction 10. The bit line 100 includes a nonmagnetic core 110 and a ferromagnetic liner 120. The nonmagnetic core 110 includes a liner such as Cu. The ferromagnetic liner 120 is preferably a soft ferromagnetic liner 120. The soft ferromagnetic liner 120 has a low coercivity. For example, the soft ferromagnetic liner 120 may include Permalloy or CZC (Cobalt-zirconium-chromium). The first embodiment of the soft ferromagnetic liner 120 extends around the sides and top of the nonmagnetic core 110. The cross section of the soft ferromagnetic liner 120 is essentially a horseshoe magnet. In addition, the soft ferromagnetic liner 120 includes tabs 122 and 124 that extend across a portion of the bottom of the nonmagnetic core 110. In a preferred embodiment, the thickness of the soft ferromagnetic liner 120 is approximately thirty to fifty Angstroms, but depends upon the design of the bit line 100. Also in a preferred embodiment, the soft ferromagnetic liner 120 is the thinnest possible that provides the desired performance of the bit line 100. The tabs 122 and 124 are preferably between 0.01 and twenty percent of the width of the bit line, L. In the embodiment 100 of the bit line, the tabs 122 and 124 are adjacent to the free layer 40. Thus, the end of the tabs 122 and 124 may abut the ends of the free layer 40, as shown in FIG. 3.

The soft ferromagnetic liner 120 concentrates the flux due to a current driven through the bit line 100. As a result, less current is required to be driven through the bit line 100 to switch the magnetization of the free layer 40. The tabs 122 and 124 reduce the gap between the soft ferromagnetic liner 120 and the free layer 40 of the magnetic tunneling junction 10. Consequently, the leakage of magnetic flux is further reduced by the tabs 122 and 124. The current required to be driven through the bit line 100 during writing is, therefore, further reduced. Consequently, power consumption of a magnetic memory using the bit line 100 in the write mode is further reduced.

Figure 4:
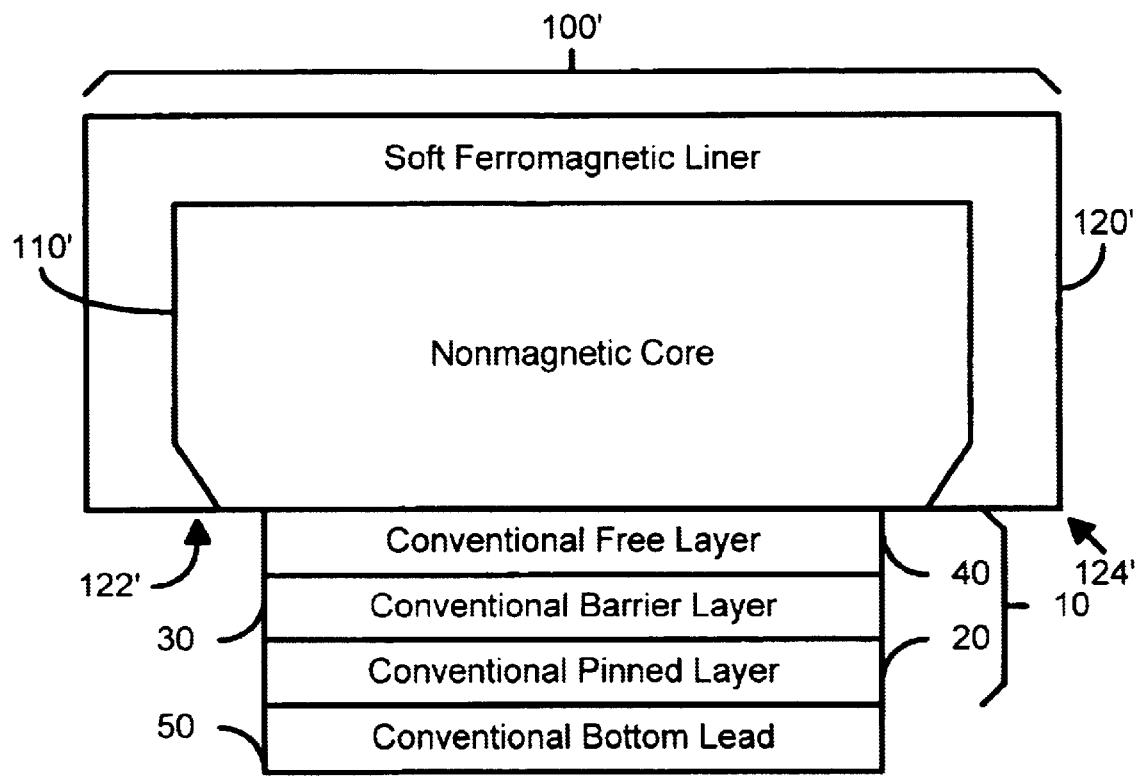
FIG. 4 is a diagram of one embodiment of a magnetic tunneling junction using a second embodiment of a bit line in accordance with the present invention.

FIG. 4 is a diagram of one embodiment of a magnetic tunneling junction 10 using a second embodiment of a bit line 100' in accordance with the present invention. The magnetic tunneling junction 10 includes a pinned layer 20, a barrier layer 30 and a free layer 40. The pinned layer 20 and the free layer 40 are ferromagnetic. The pinned layer 20 and/or the free layer 40 may be synthetic. Other layers may also be synthetic, multilayers, alloys or other materials. The pinned layer 20 has its magnetization substantially fixed, while the magnetization of the free layer 40 can respond to an applied magnetic field. Generally, the magnetization of the pinned layer 20 is fixed using an antiferromagnetic layer (not shown) grown on an appropriate seed layer (not shown). The barrier layer 30 is an insulating layer sufficiently thin to allow the tunneling of current carriers between the pinned layer 20 and the free layer 40. The magnetic tunneling junction 10 is preferably grown on a bottom lead 50.

The bit line 100' preferably resides on the magnetic tunneling junction 10. The bit line 100' includes a nonmagnetic core 110' and a ferromagnetic liner 120'. The nonmagnetic core 110' includes a liner such as Cu. The ferromagnetic liner 120' is preferably a soft ferromagnetic liner 120'. The soft ferromagnetic liner 120' has a low coercivity. For example, the soft ferromagnetic liner 120' may include Permalloy or CZC. The first embodiment of the soft ferromagnetic liner 120' extends around the sides and top of the nonmagnetic core 110'. The cross section of the soft ferromagnetic liner 120' is essentially a horseshoe magnet. In addition, the soft ferromagnetic liner 120' includes tabs 122' and 124' that extend across a portion of the bottom of the nonmagnetic core 110'. In a preferred embodiment, the thickness of the soft ferromagnetic liner 120' is approximately thirty to fifty Angstroms, but depends upon the design of the bit line 100'. Also in a preferred embodiment, the soft ferromagnetic liner 120' is the thinnest possible that provides the desired performance of the bit line 100'. The tabs 122' and 124' are preferably between 0.01 and twenty percent of the width of the bit line, L. In the embodiment 100' of the bit line, the ends of the tabs 122 and 124 lie outside of the free layer 40. Thus, the end of the tabs 122' and 124' are not adjacent to the free layer 40. Thus, the tabs 122' and 124' lie at the outer edge of the bit line 100'.

The soft ferromagnetic liner 120' concentrates the flux due to a current driven through the bit line 100'. As a result, less current is required to be driven through the bit line 100' to switch the magnetization of the free layer 40. The tabs 122' and 124' reduce the gap between the soft ferromagnetic liner 120' and the free layer 40 of the magnetic tunneling junction 10. Consequently, the leakage of magnetic flux is further reduced by the tabs 122' and 124'. The current required to be driven through the bit line 100' during writing is, therefore, further reduced. Consequently, power consumption of a magnetic memory using the bit line 100' in the write mode is further reduced.

Figure 5:
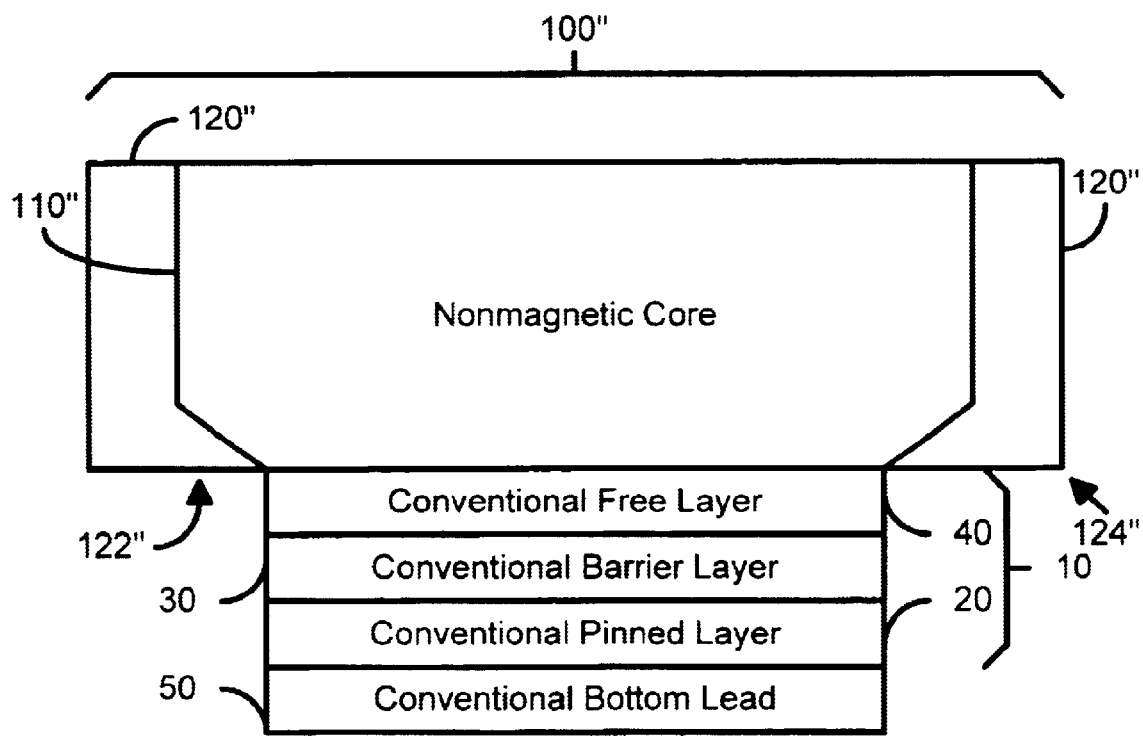
FIG. 5 is a diagram of one embodiment of a magnetic tunneling junction using a third embodiment of a bit line in accordance with the present invention.

FIG. 5 is a diagram of one embodiment of a magnetic tunneling junction using a third embodiment of a bit line 100" in accordance with the present invention. The magnetic tunneling junction 10 includes a pinned layer 20, a barrier layer 30 and a free layer 40. The pinned layer 20 and the free layer 40 are ferromagnetic. The pinned layer 20 and/or the free layer 40 may be synthetic. Other layers may also be synthetic, multilayers, alloys or other materials. The pinned layer 20 has its magnetization substantially fixed, while the magnetization of the free layer 40 can respond to an applied magnetic field. Generally, the magnetization of the pinned layer 20 is fixed using an antiferromagnetic layer (not shown) grown on an appropriate seed layer (not shown). The barrier layer 30 is an insulation layer sufficiently thin to allow the tunneling of current carriers between the pinned layer 20 and the free layer 40. The magnetic tunneling junction 10 is preferably grown on a bottom lead 50.

The bit line 100" preferably resides on the magnetic tunneling junction 10. The bit line 100" includes a nonmagnetic core 110" and a ferromagnetic liner 120". The nonmagnetic core 110" includes a liner such as Cu. The ferromagnetic liner 120" is preferably a soft ferromagnetic liner 120". The soft ferromagnetic liner 120" has a low coercivity. For example, the soft ferromagnetic liner 120" may include Permalloy or CZC. The first embodiment of the soft ferromagnetic liner 120" extends around the sides of the nonmagnetic core 110". The cross section of the soft ferromagnetic liner 120" is, therefore, not a horseshoe magnet. In addition, the soft ferromagnetic liner 120" includes tabs 122" and 124" that extend across a portion of the bottom of the nonmagnetic core 110". In a preferred embodiment, the thickness of the soft ferromagnetic liner 120" is approximately thirty to fifty Angstroms, but depends upon the design of the bit line 100". Also in a preferred embodiment, the soft ferromagnetic liner 120" is the thinnest possible that provides the desired performance of the bit line 100". The tabs 122" and 124" are preferably between 0.01 and twenty percent of the width of the bit line, L. In the embodiment 100" of the bit line, the tabs 122" and 124" are adjacent to the free layer 40. Thus, the end of the tabs 122" and 124" may abut the ends of the free layer 40, as shown in FIG. 5. However, in an alternate embodiment, the ends of the tables 122" and 124" are nearer to the outer edges of the bit line 100", not adjacent to the edges of the free layer 40.

The soft ferromagnetic liner 120" concentrates the flux due to a current driven through the bit line 100". As a result, less current is required to be driven through the bit line 100" to switch the magnetization of the free layer 40. The tabs 122" and 124" reduce the gap between the soft ferromagnetic liner 120" and the free layer 40 of the magnetic tunneling junction 10. Consequently, the leakage of magnetic flux is further reduced by the tabs 122" and 124". The current required to be driven through the bit line 100" during writing is, therefore, further reduced. Consequently, power consumption of a magnetic memory using the bit line 100" in the write mode is further reduced.

Figure 6:
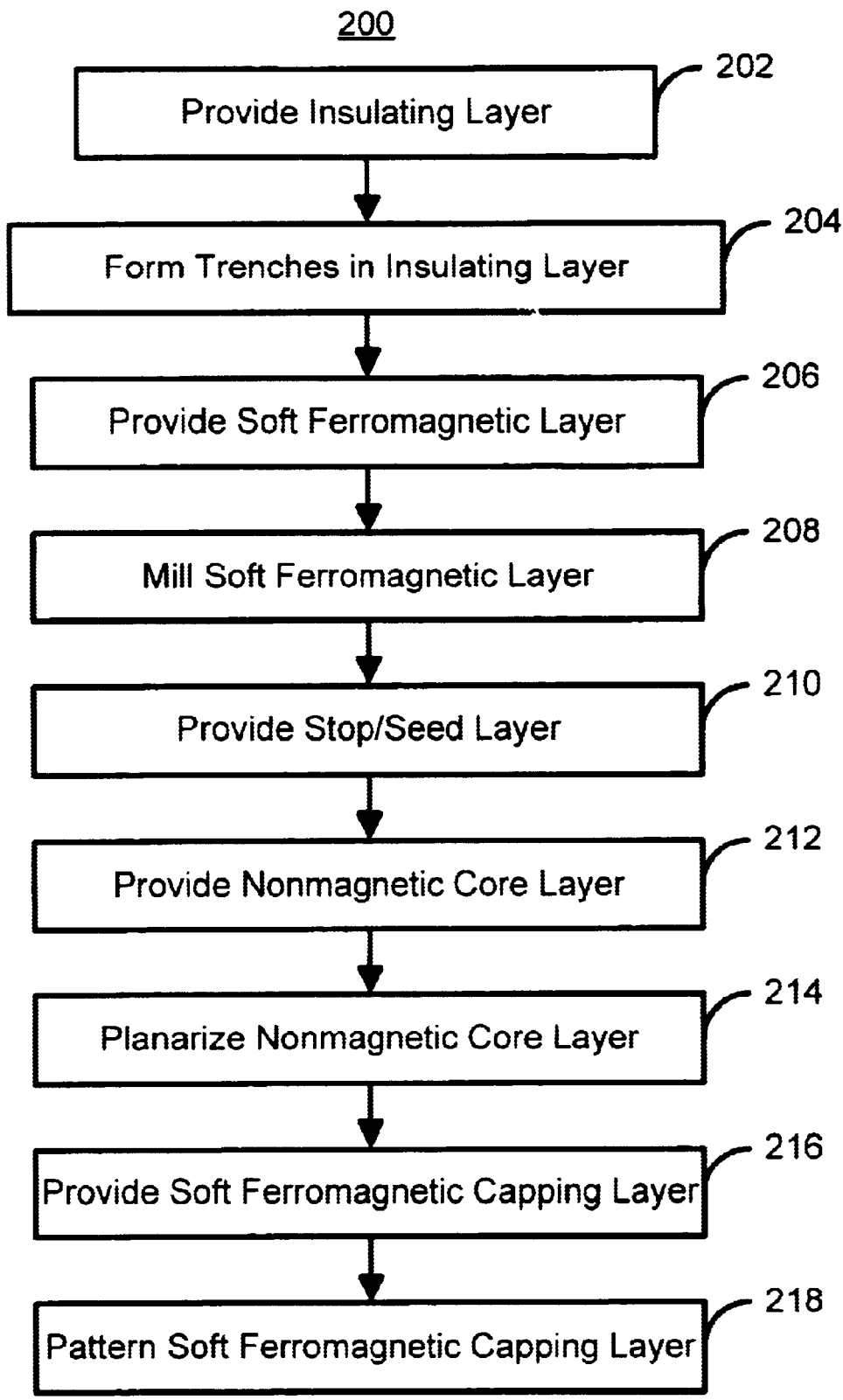
FIG. 6 is a high-level flow chart of one embodiment of a method in accordance with the present invention.
Figure 7A:
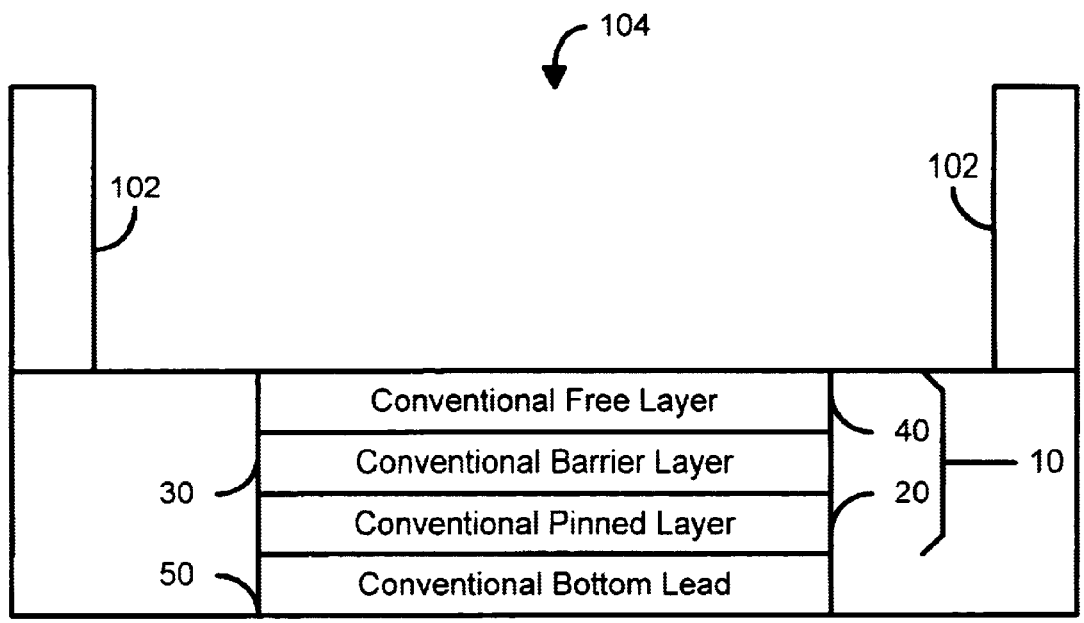
FIGS. 7A–7H depict one embodiment of a magnetic tunneling junction using the first embodiment of a bit line in accordance with the present invention during fabrication.
Figure 7B:
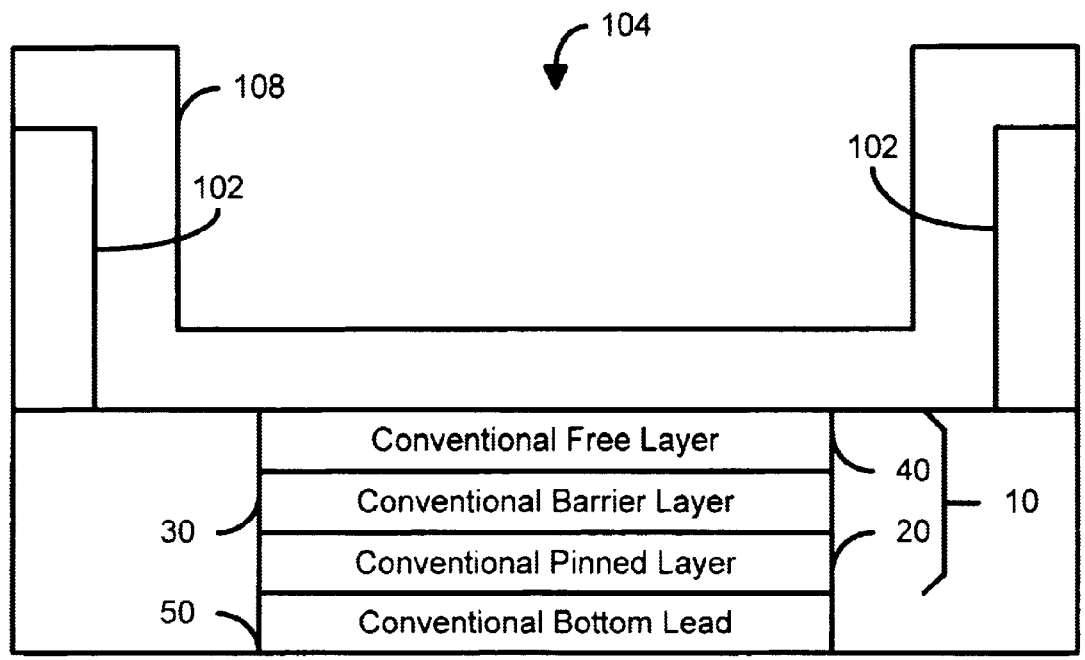
Figure 7C:
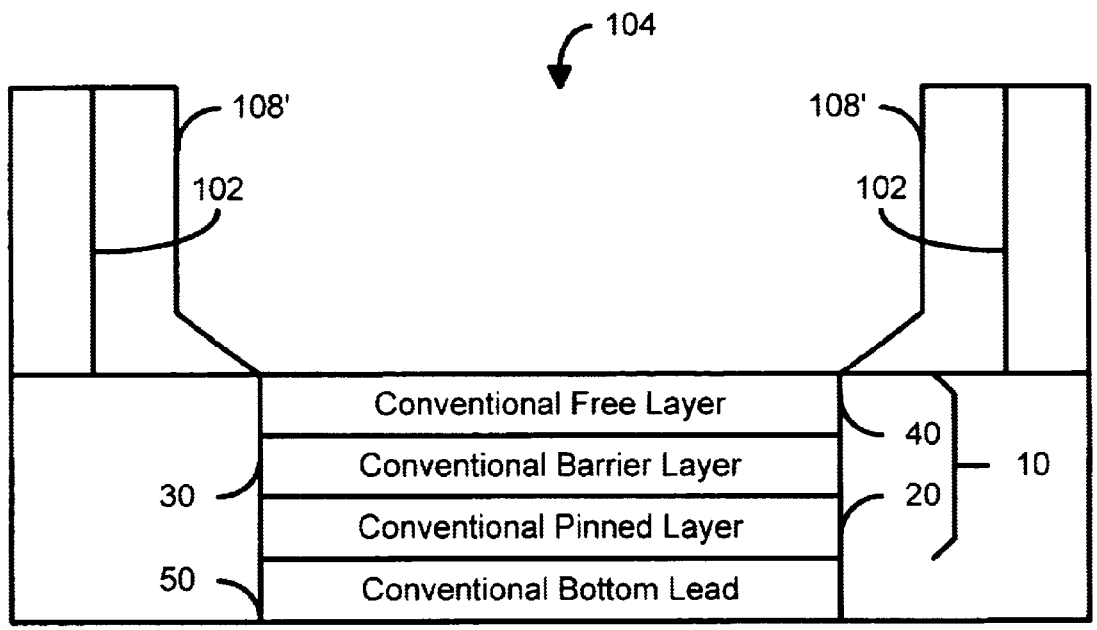
Figure 7D:
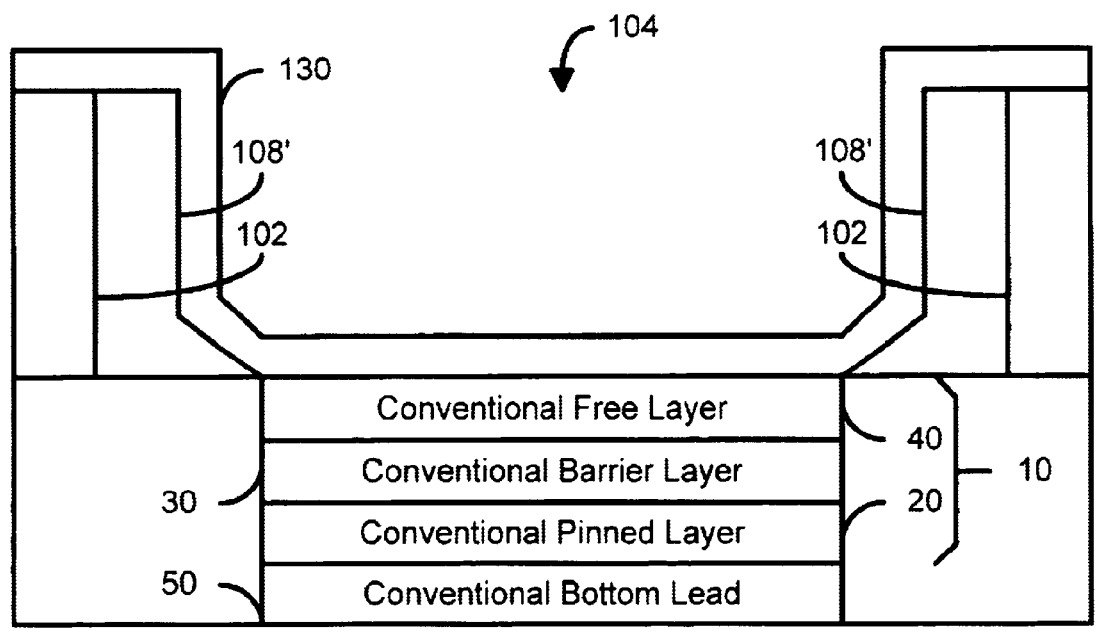
Figure 7E:
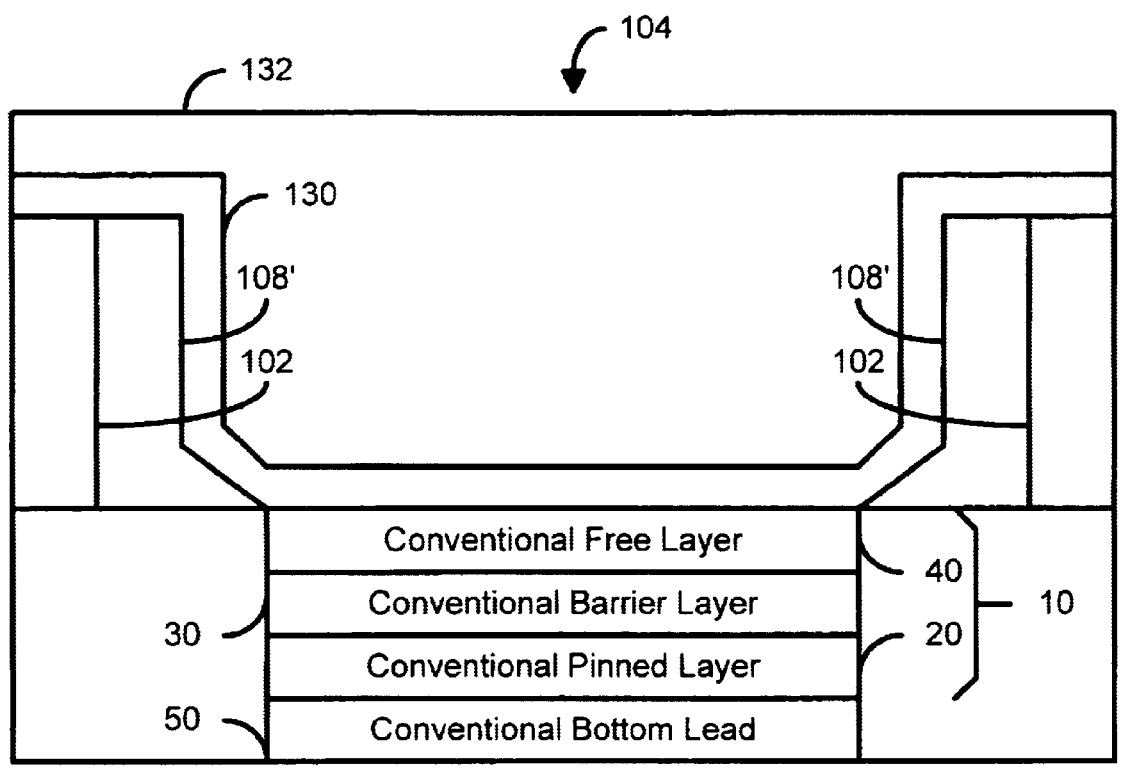
Figure 7F:
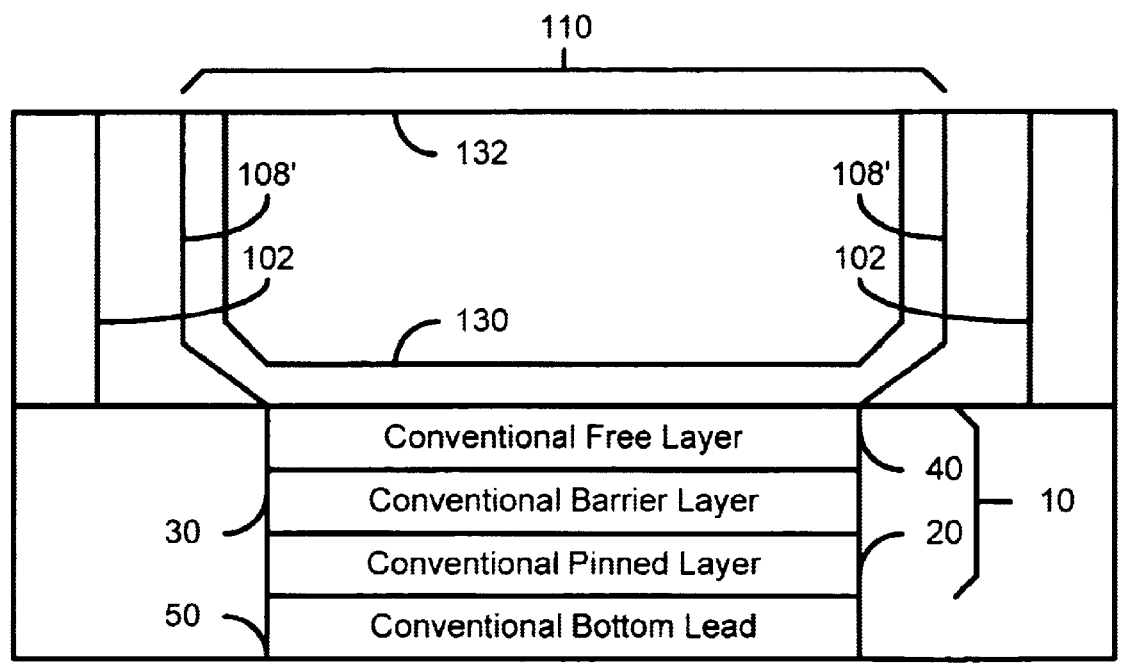
Figure 7G:
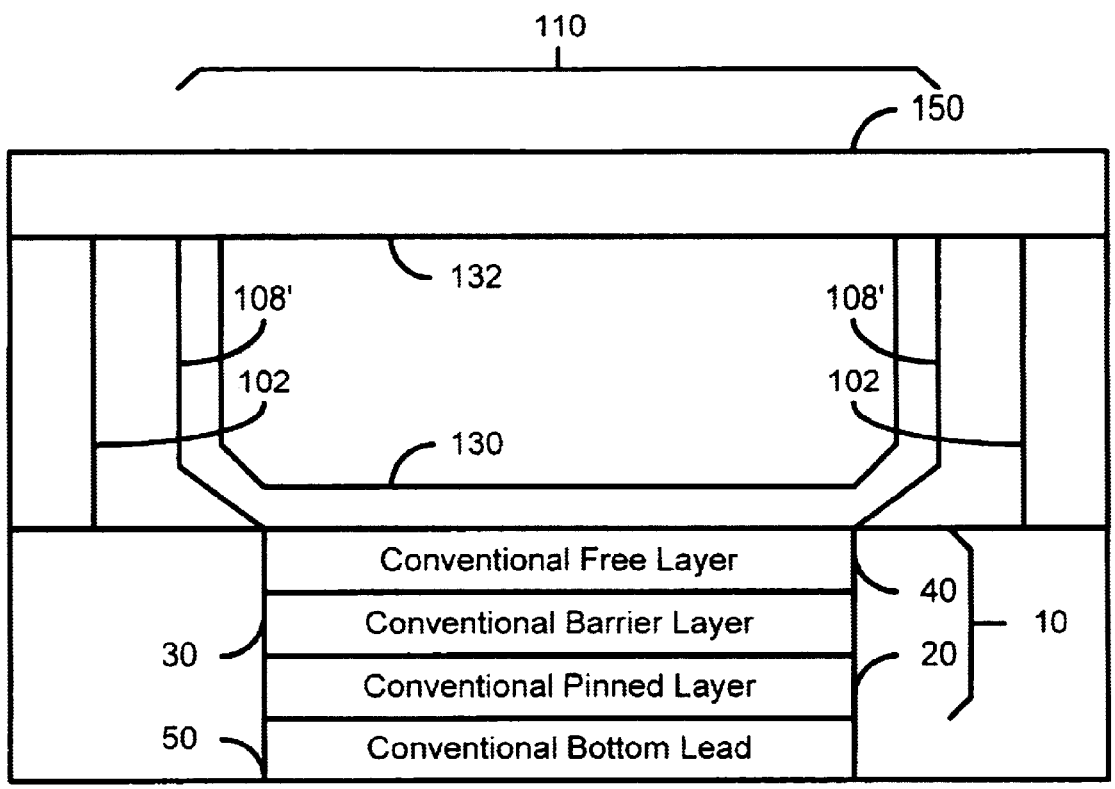
Figure 7H:
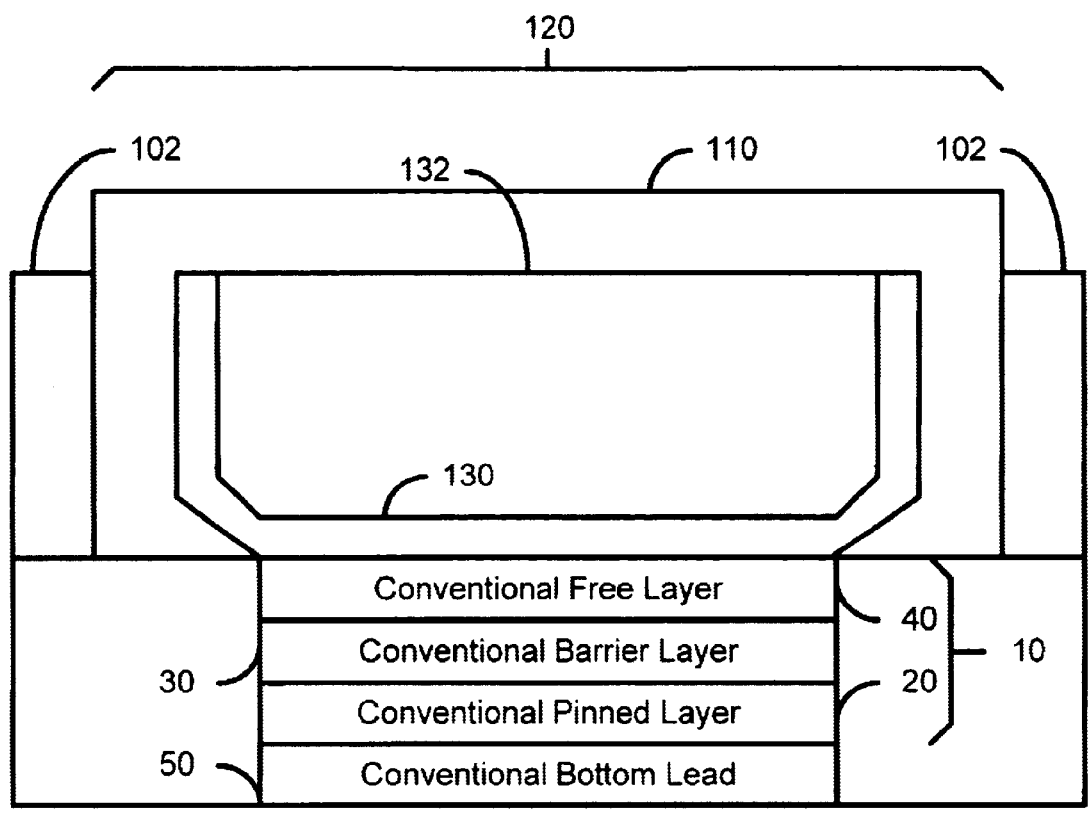

FIG. 6 is a flow chart of one embodiment of a method 200 in accordance with the present invention. FIGS. 7A–7H depict of one embodiment of a magnetic tunneling junction 10 using the first embodiment of a bit line 100 in accordance with the present invention during fabrication. The method 200 is described in conjunction with the first embodiment of the bit line 100 depicted in FIGS. 7A–7H. Referring to FIGS. 6 and 7A–7H, the method 200 commences after formation of the magnetic tunneling junction 10. The magnetic tunneling junction 10 is preferably formed above and insulated from a digit line. An insulating layer, such as $SiO_2$, is formed on the magnetic tunneling junction 10, via step 202. A trench is then formed in the insulating layer, via step 204. FIG. 7A depicts the trench 104 formed in the insulating layer 102. A layer of soft magnetic material, such as NiFe, is then deposited, via step 206. Preferably, the thickness of the layer of soft ferromagnetic material is between twenty and five hundred Angstroms. The soft ferromagnetic layer is also preferably deposited using ion beam deposition or physical vapor deposition. FIG. 7B depicts the soft ferromagnetic layer 108. The ferromagnetic layer is then etched to remove the portion of the ferromagnetic layer outside of the trench and to from the tabs, via step 208. An ion mill is preferably used to remove the soft ferromagnetic material in step 208. In addition, the length of the tab can be controlled using the angle and beam divergence of the ion mill. FIG. 7C depicts the ferromagnetic layer 108' after the ion milling has been completed in step 208. A stop layer, such as Ta or TaN, may then be deposited, via step 210. Also in step 210, a seed layer, preferably formed of Cu, is also provided. The stop layer acts as an etch stop for a chemical mechanical polish (CMP) step that can be performed later. FIG. 7D depicts the stop seed layer 130. The nonmagnetic core is then provided, preferably by plating Cu, via step 212. FIG. 7E depicts the layer of copper 132 that has been plated. The system is then planarized preferably using CMP, removing the portion of the copper layer 132 outside of the trench 104, via step 214. The stop layer provided in step 210 can be used as the CMP stop layer. FIG. 7F depicts the system after planarization. Thus, the nonmagnetic core 110 has been formed. A capping layer of soft magnetic material, such as NiFe, may be provided, via step 216. The capping layer is preferably twenty to five hundred Angstroms thick. Preferably, the capping layer is deposited using sputtering or ion beam deposition. FIG. 7G depicts the capping layer 150 after deposition. The capping layer 150 is then patterned to form the top of the soft ferromagnetic liner, via step 218. FIG. 7H depicts the bit line 100 after completion of the soft ferromagnetic liner 120. Using the method 200 a bit line, magnetic tunneling junction and magnetic memory having improved power consumption can be provided.

A method and system has been disclosed for providing an improved magnetic tunneling junction. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic tunneling junction comprising:

a free layer;

a pinned layer; and a barrier between the free layer and the pinned layer, the free layer and the pinned layer being ferromagnetic, the barrier layer being an insulator; and the magnetic tunneling junction being coupled to a bit line, the bit line including a ferromagnetic liner and a nonmagnetic core, the nonmagnetic core including a top, a bottom and sides, the ferromagnetic liner being adjacent to the sides and a portion of the bottom of the nonmagnetic core, the ferromagnetic liner including at least one tab, the at least one tab being adjacent only to the portion of the bottom of the nonmagnetic core.

2. The magnetic tunneling junction of claim 1 wherein the ferromagnetic liner is also adjacent to the top of the nonmagnetic core.

3. The magnetic tunneling junction of claim 2 wherein at least one the tab further includes an end and wherein the end of the at least one tab is adjacent to the magnetic tunneling junction.

4. The magnetic tunneling junction of claim 1 wherein the tab further includes an end and wherein the end of the at least one tab is adjacent to the magnetic tunneling junction.

5. A magnetic memory comprising:

a plurality of magnetic tunneling junctions, each of the plurality of magnetic tunneling junctions including a free layer, a pinned layer and a barrier between the free layer and the pinned layer, the free layer and the pinned layer being ferromagnetic, the barrier layer being an insulator; and a plurality of bit lines coupled to the plurality of magnetic tunneling junctions, each of the plurality of bit lines including a ferromagnetic liner and a nonmagnetic core, the nonmagnetic core including a top, a bottom and sides, the ferromagnetic liner being adjacent to the sides and a portion of the bottom of the nonmagnetic core, the ferromagnetic liner including at least one tab, the at least one tab being adjacent only to the portion of the bottom of the nonmagnetic core.

6. The magnetic memory of claim 5 wherein the ferromagnetic liner is also adjacent to the top of the nonmagnetic core.

7. The magnetic memory of claim 6 wherein the tab further includes an end and wherein the end of the at least one tab is adjacent to the magnetic tunneling junction.

8. The magnetic memory of claim 5 wherein the tab further includes an end and wherein the end of the at least one tab is adjacent to the magnetic tunneling junction.

9. A method for providing a magnetic memory comprising the steps of:

(a) providing a plurality of bit lines, each of the plurality of bit lines including a ferromagnetic liner and a nonmagnetic core, the nonmagnetic core including a top, a bottom and sides, the ferromagnetic liner being adjacent to the sides and a portion of the bottom of the nonmagnetic core, the ferromagnetic liner including at least one tab, the at least one tab being adjacent only to the portion of the bottom of the nonmagnetic core; and (b) providing a plurality of magnetic tunneling junctions, each of the plurality of magnetic tunneling junctions including a free layer, a pinned layer and a barrier between the free layer and the pinned layer, the free layer and the pinned layer being ferromagnetic, the barrier layer being an insulator.

10. The method of claim 9 wherein the ferromagnetic liner is also adjacent to the top of the nonmagnetic core.

11. The method of claim 10 wherein the at least one tab further includes an end and wherein the end of the at least one tab is adjacent to the magnetic tunneling junction.

12. The method of claim 9 wherein the at least one tab further includes an end and wherein the end of the at least one tab is adjacent to the magnetic tunneling junction.

13. A method for providing a magnetic tunneling junction comprising the steps of:

(a) providing a pinned layer, the pinned layer being ferromagnetic;

(b) providing a barrier layer;

(c) providing a free layer, the barrier layer being between the free layer and the pinned layer, the free layer being ferromagnetic, the barrier layer being an insulator; and wherein the magnetic tunneling junction is coupled to a bit line, the bit line including a ferromagnetic liner and a nonmagnetic core, the nonmagnetic core including a top, a bottom and sides, the ferromagnetic liner being adjacent to the sides and a portion of the bottom of the nonmagnetic core, the ferromagnetic liner including at least one tab, the at least one tab being adjacent only to the portion of the bottom of the nonmagnetic core.

14. The method of claim 13 wherein the ferromagnetic liner is also adjacent to the top of the nonmagnetic core.

15. The method of claim 14 wherein the at least one tab further includes an end and wherein the end of the at least one tab is adjacent to the magnetic tunneling junction.

16. The method of claim 13 wherein the at least one tab further includes an end and wherein the end of the at least one tab is adjacent to the magnetic tunneling junction.

17. A magnetic memory comprising:

a plurality of magnetic cells; and a plurality of bit lines coupled to the plurality of magnetic cells, each of the plurality of bit lines including a ferromagnetic liner and a nonmagnetic core, the nonmagnetic core including a first side, a second side opposite to the first side, a third side between the first side and the second side, and a fourth side opposite to the third side. The magnetic cell being adjacent to a first portion of the third side, the ferromagnetic liner being adjacent to the first side, the second side and a second portion of the third side of the nonmagnetic core, the ferromagnetic liner including at least one tab, the at least one tab being adjacent to only the second portion of the third side of the nonmagnetic core.

* * * * *